United States Patent
Hong

(10) Patent No.: US 11,917,926 B2
(45) Date of Patent: Feb. 27, 2024

(54) SYNTHETIC ANTIFERROMAGNETIC MATERIAL AND MULTIBIT MEMORY USING SAME

(71) Applicant: Industry-University Cooperation Foundation Hanyang University, Seoul (KR)

(72) Inventor: Jin Pyo Hong, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 149 days.

(21) Appl. No.: 17/630,574

(22) PCT Filed: Jun. 23, 2020

(86) PCT No.: PCT/KR2020/008101
§ 371 (c)(1),
(2) Date: Jan. 27, 2022

(87) PCT Pub. No.: WO2021/020736
PCT Pub. Date: Feb. 4, 2021

(65) Prior Publication Data
US 2022/0263014 A1 Aug. 18, 2022

(30) Foreign Application Priority Data
Jul. 30, 2019 (KR) .................. 10-2019-0092422

(51) Int. Cl.
*G11C 11/16* (2006.01)
*G11C 11/56* (2006.01)
(Continued)

(52) U.S. Cl.
CPC ........... *H10N 52/80* (2023.02); *G11C 11/161* (2013.01); *G11C 11/1673* (2013.01);
(Continued)

(58) Field of Classification Search
CPC .............. G11C 11/161; G11C 11/1673; G11C 11/1675; G11C 11/5607
(Continued)

(56) References Cited

U.S. PATENT DOCUMENTS 8,184,408 B2 * 5/2012 Murakami ............. H10N 50/01
257/422
9,741,372 B1 * 8/2017 Campiglio ............ B32B 15/018
(Continued)

FOREIGN PATENT DOCUMENTS

JP 2008-252036 A 10/2008
KR 10-2013-0015928 A 2/2013
(Continued)

OTHER PUBLICATIONS

International Search Report of PCT/KR2020/008101 dated Sep. 22, 2020 [PCT/ISA/210].

*Primary Examiner* — Ly D Pham
(74) *Attorney, Agent, or Firm* — Sughrue Mion, PLLC

(57) ABSTRACT

Disclosed are a synthetic antiferromagnetic material using the Ruderman-Kittel-Kasuya-Yosida (RKKY) interaction and a multibit memory using the synthetic antiferromagnetic material that is formed. The synthetic antiferromagnetic material has a non-magnetic metal layer as an RKKY inducing layer in the center, interaction between upper and lower ferromagnetic layers is imparted according to the thickness of the RKKY inducing layer, and the magnetization of an anti-parallel state is maximized therebetween. When such synthetic antiferromagnetic materials are cumulatively stacked and tunnel barrier layers are provided therebetween, multiple bits can be stored. Namely, data may be stored by supplying a program current in parallel to the surface of the RKKY inducing layer, and a resistance state
(Continued)

may be checked by supplying current in a vertical direction to the surface of the RKKY inducing layer.

11 Claims, 8 Drawing Sheets

(51) Int. Cl.
　　H10B 61/00　　(2023.01)
　　H10N 50/85　　(2023.01)
　　H10N 52/00　　(2023.01)
　　H10N 52/80　　(2023.01)
(52) U.S. Cl.
　　CPC ...... *G11C 11/1675* (2013.01); *G11C 11/5607* (2013.01); *H10B 61/00* (2023.02); *H10N 50/85* (2023.02); *H10N 52/00* (2023.02)
(58) Field of Classification Search
　　USPC .......................................................... 365/158
　　See application file for complete search history.

(56) References Cited

U.S. PATENT DOCUMENTS

| | | | | |
|---|---|---|---|---|
| 10,403,343 | B2* | 9/2019 | Bozdag | H10N 50/10 |
| 2008/0206891 | A1* | 8/2008 | Wang | G01N 33/5434 |
| | | | | 436/526 |
| 2009/0161424 | A1* | 6/2009 | Redon | G11C 11/16 |
| | | | | 365/171 |
| 2010/0085666 | A1* | 4/2010 | Zhou | B82Y 10/00 |
| | | | | 427/126.3 |
| 2010/0128510 | A1* | 5/2010 | Cowburn | G11C 19/0808 |
| | | | | 365/158 |
| 2013/0032910 | A1 | 2/2013 | Jung et al. | |
| 2013/0077391 | A1* | 3/2013 | Luo | G11C 11/161 |
| | | | | 365/158 |
| 2014/0133221 | A1* | 5/2014 | Cowburn | G11C 11/14 |
| | | | | 365/158 |
| 2014/0268428 | A1* | 9/2014 | Dimitrov | G11B 5/3912 |
| | | | | 360/313 |
| 2015/0194597 | A1* | 7/2015 | Fermon | H10N 50/10 |
| | | | | 257/421 |
| 2015/0221326 | A1* | 8/2015 | Jung | G11B 5/3906 |
| | | | | 360/328 |
| 2015/0294708 | A1* | 10/2015 | Annunziata | G11C 11/5607 |
| | | | | 365/158 |
| 2015/0340600 | A1 | 11/2015 | Kim et al. | |
| 2016/0211062 | A1* | 7/2016 | Granger | B22F 1/0553 |
| 2016/0359103 | A1* | 12/2016 | Fermon | G11B 5/3909 |
| 2017/0110651 | A1 | 4/2017 | Park et al. | |
| 2018/0114898 | A1 | 4/2018 | Lee | |
| 2020/0105326 | A1* | 4/2020 | Tzoufras | G11C 11/161 |

FOREIGN PATENT DOCUMENTS

| | | |
|---|---|---|
| KR | 10-2015-0134994 A | 12/2015 |
| KR | 10-2017-0045692 A | 4/2017 |
| KR | 10-2018-0043696 A | 4/2018 |

* cited by examiner

[FIG. 1]
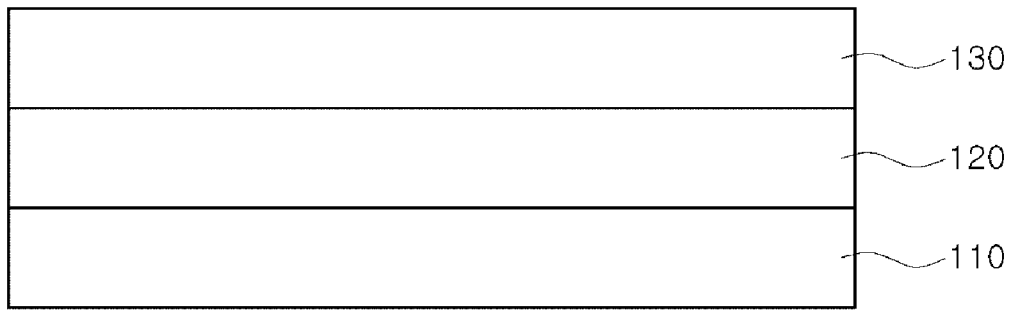
[FIG. 2]
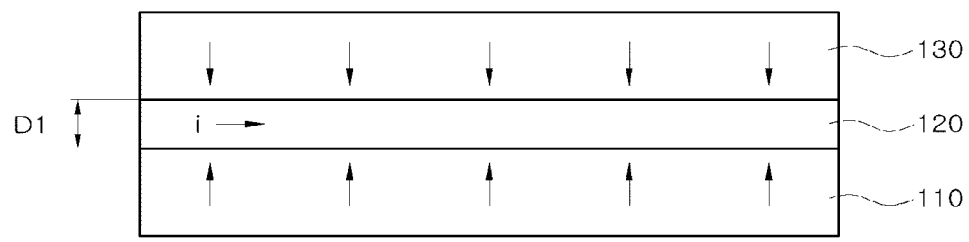
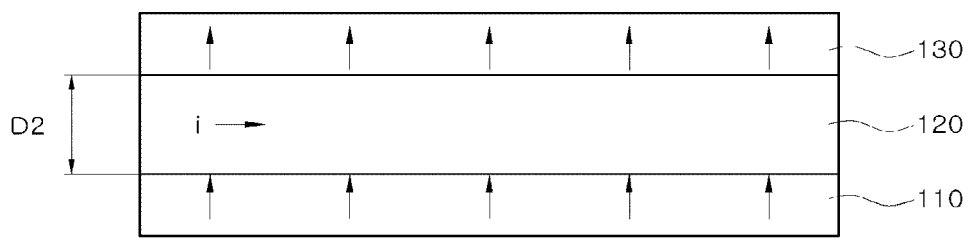
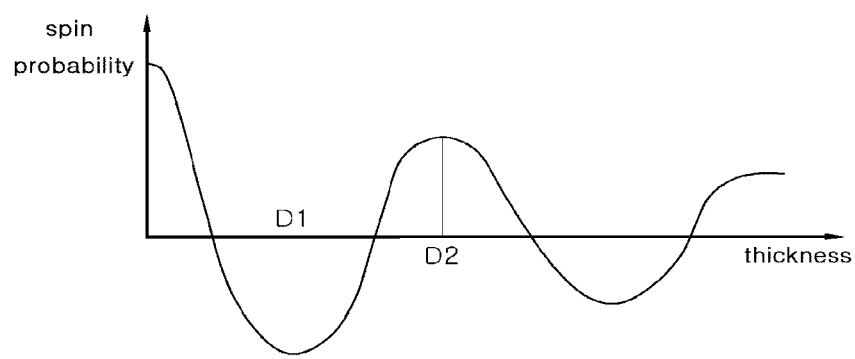

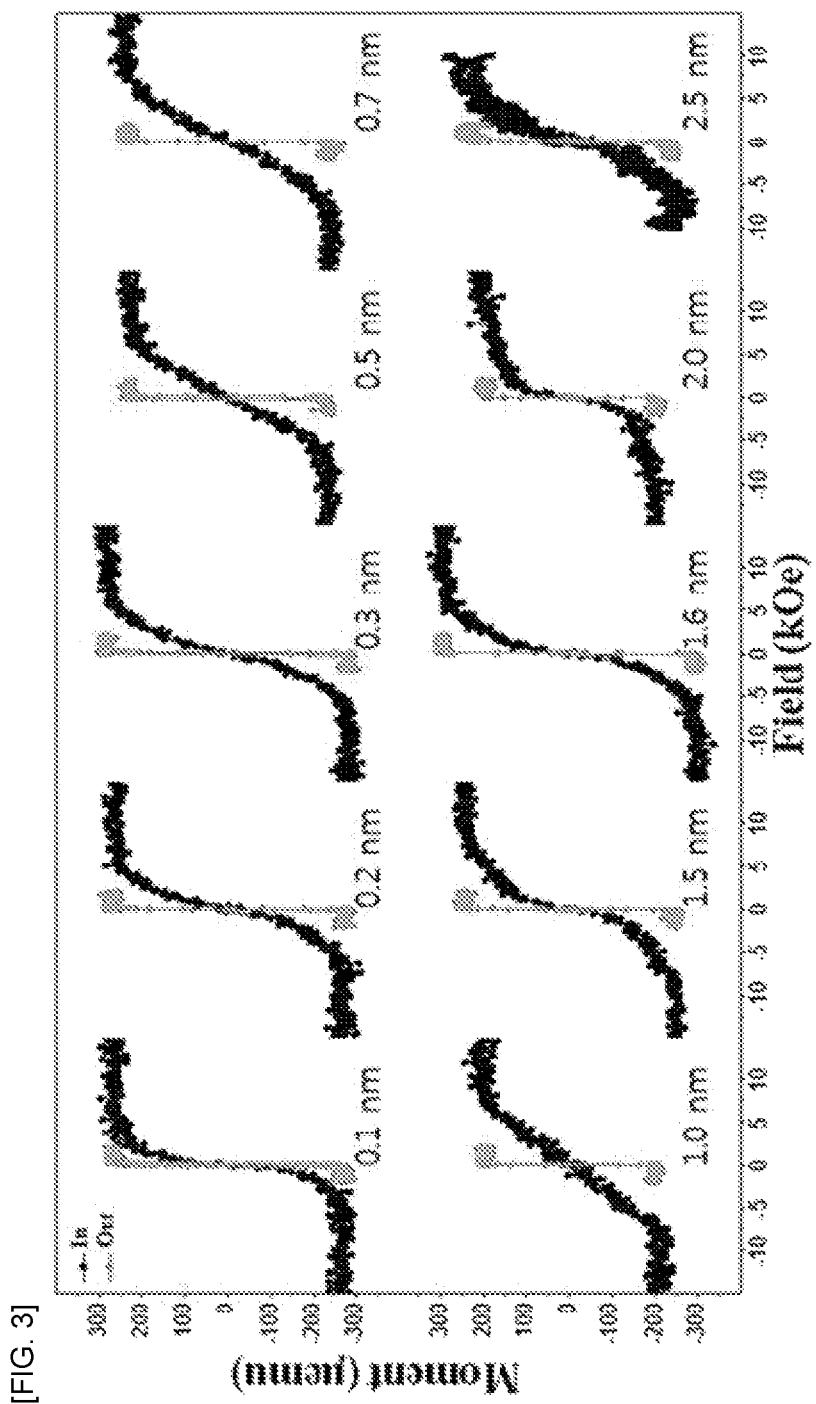
[FIG. 3]

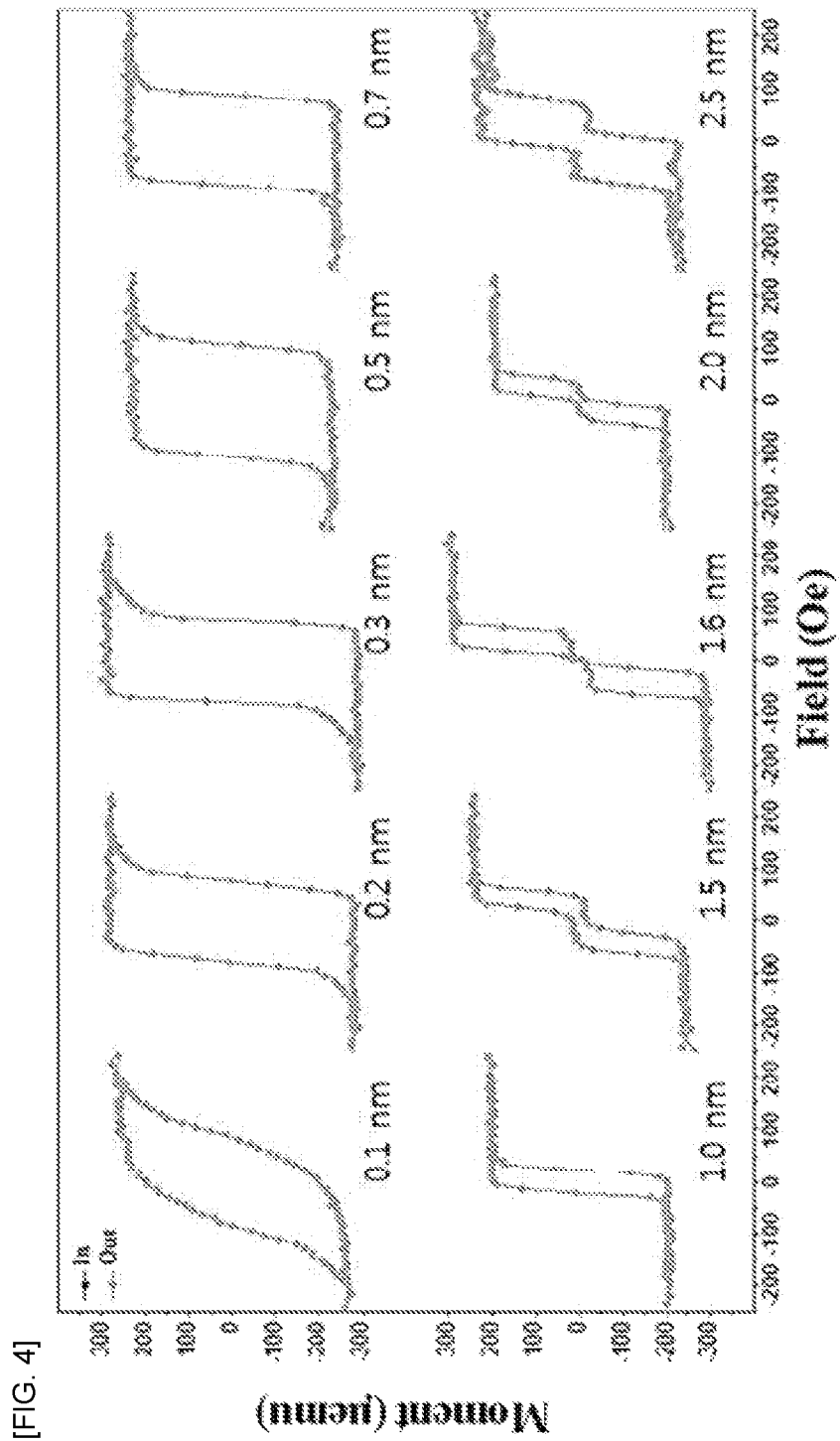
[FIG. 4]

[FIG. 5]
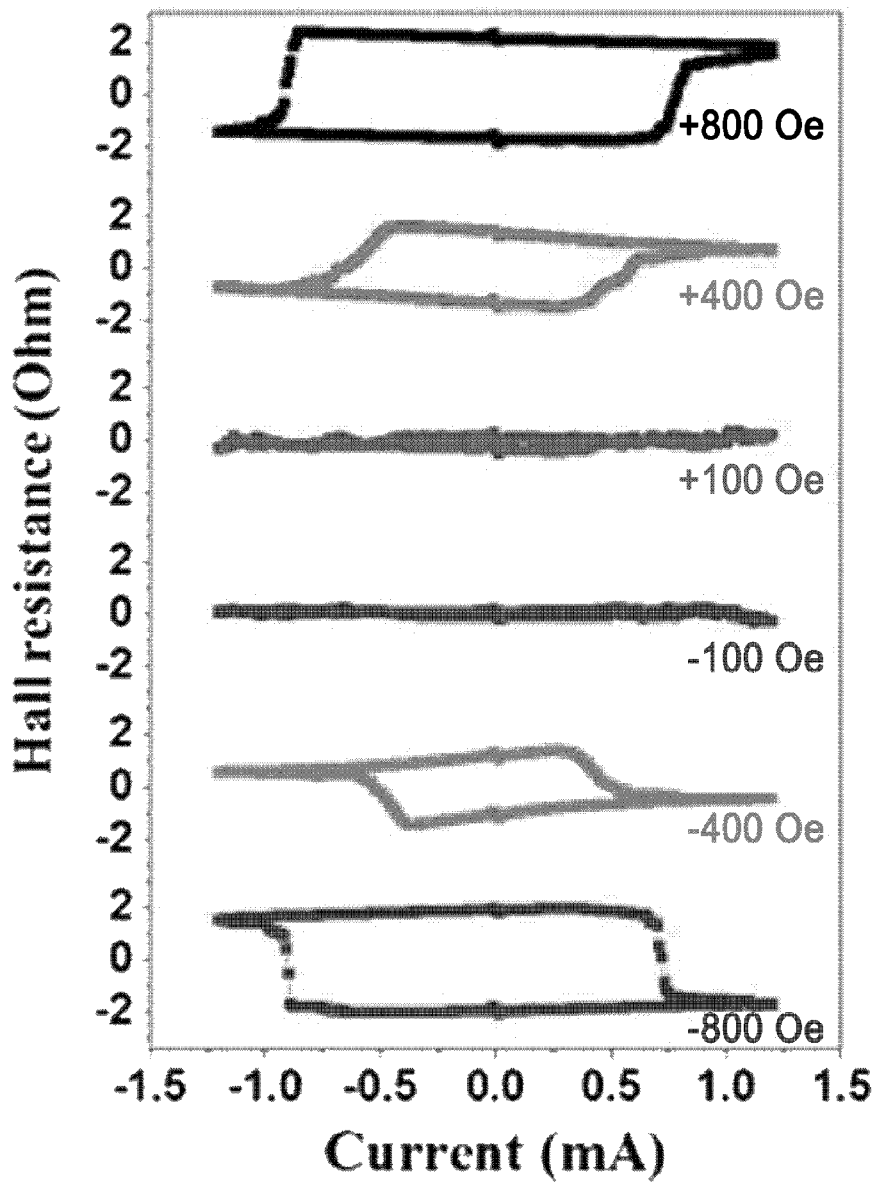

[FIG. 6]
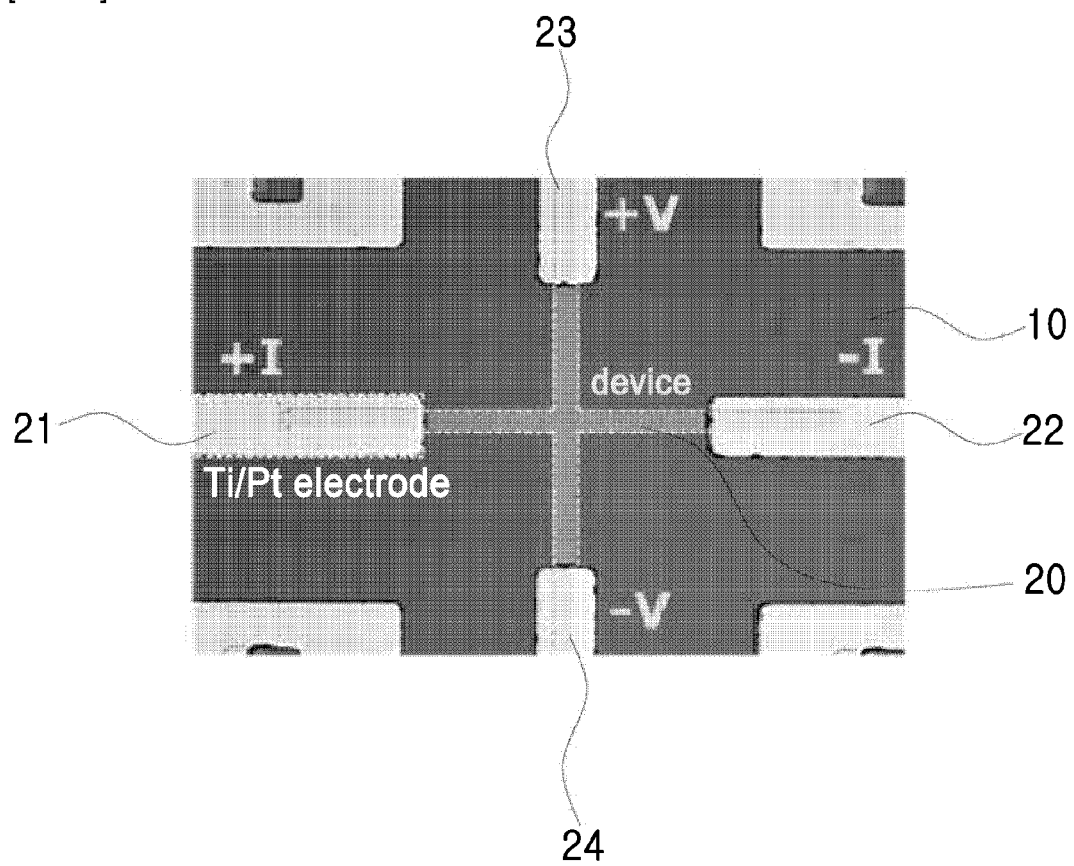

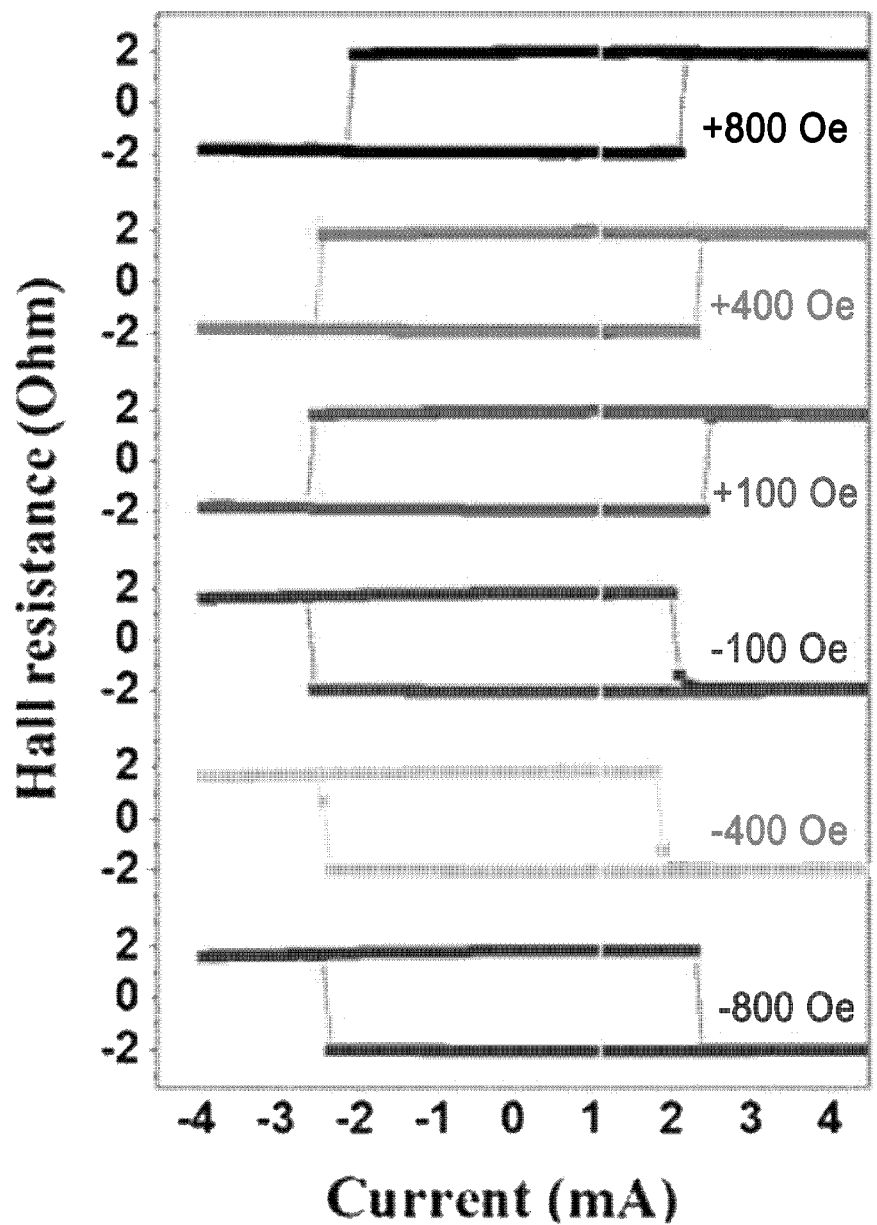
[FIG. 7]

[FIG. 8]
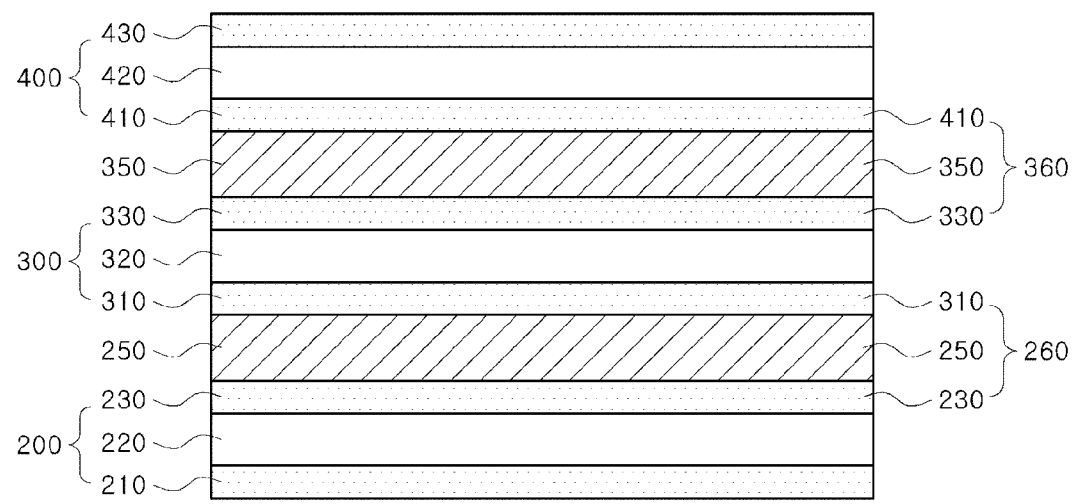
[FIG. 9]
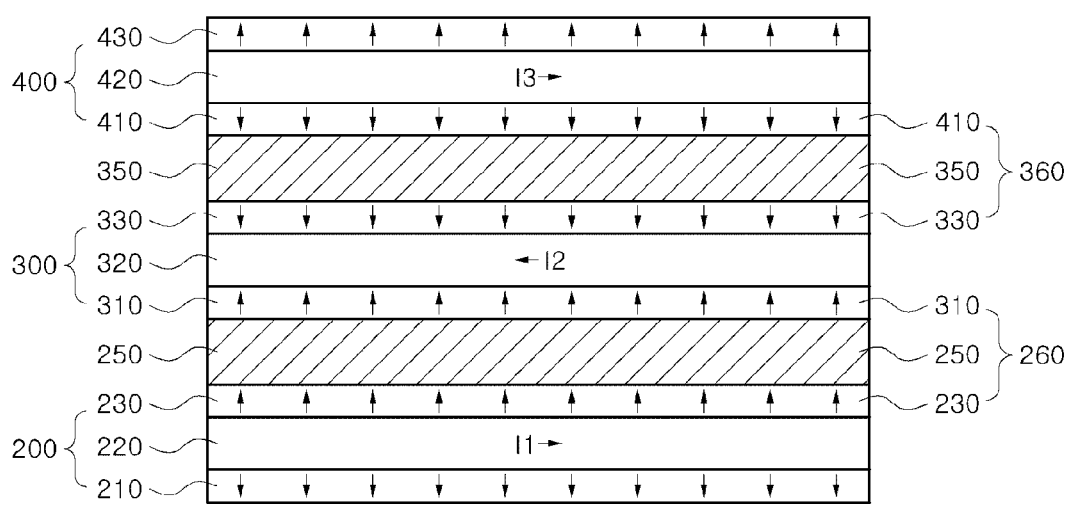

[FIG. 10]
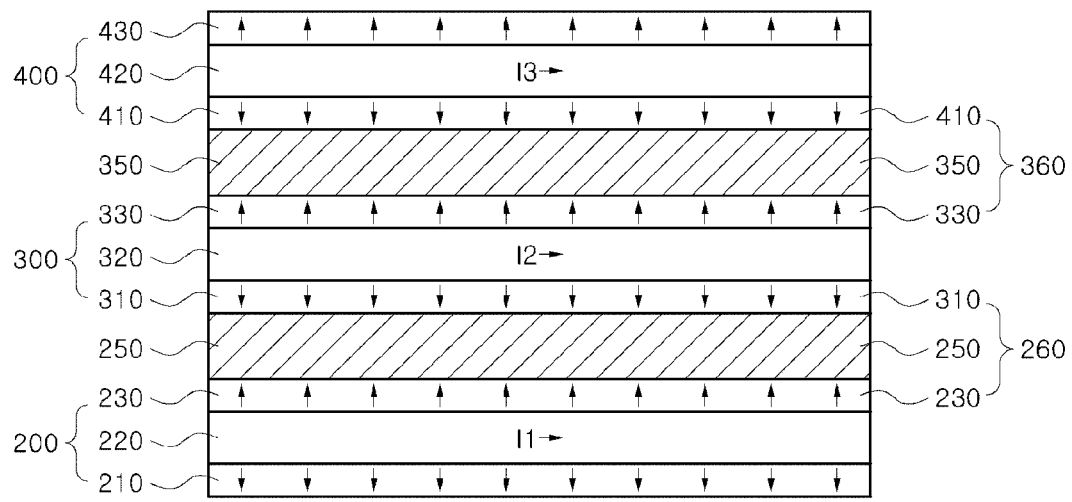
[FIG. 11]
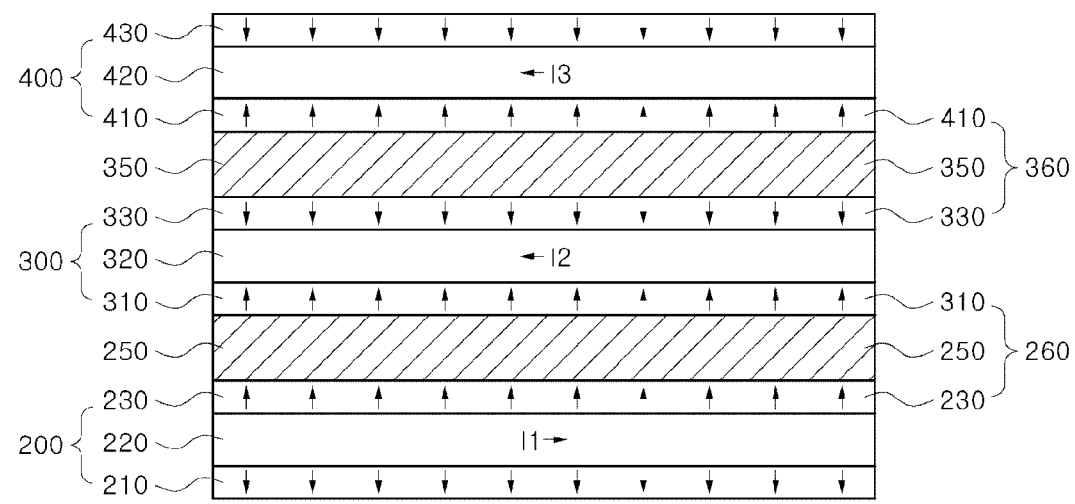

SYNTHETIC ANTIFERROMAGNETIC MATERIAL AND MULTIBIT MEMORY USING SAME

CROSS REFERENCE TO RELATED APPLICATIONS

This application is a National Stage of International Application No. PCT/KR2020/008101, filed Jun. 23, 2020, claiming priority to Korean Patent Application No. 10-2019-0092422, filed Jul. 30, 2019.

TECHNICAL FIELD

The present invention relates to a structure of a synthetic antiferromagnetic material and a memory using the same, and more particularly, to a synthetic antiferromagnetic material using a spin orbit torque and the Ruderman-Kittel-Kasuya-Yosida (RKKY) interaction and a memory capable of storing multiple bits using the same.

BACKGROUND ART

Spin orbit torque, which is a combination of a spin transfer torque phenomenon and spin orbit coupling, refers to spin torque generated in a magnetic layer by spin orbit coupling when a current flows in a non-magnetic layer in a structure in which a magnetic layer and a non-magnetic layer are combined. That is, when a ferromagnetic material is disposed on a non-magnetic metal layer and a current is applied to the non-magnetic metal layer, a torque is generated in the magnetization of the ferromagnetic material by spin orbit coupling. When the torque applied to the magnetization of the ferromagnetic material is properly used, magnetic information is controlled by the current, and thus the ferromagnetic material disposed on the non-magnetic metal layer can be utilized as a memory device.

The concept of spin orbit coupling is very important to induce spin orbit torque, and spin orbit coupling is a concept representing the mutual coupling of electron spin with orbital motion. That is, moving electrons behave as if there is a magnetic field even when there is no externally applied magnetic field, and this magnetic field is proportional to the momentum of the electrons and the strength of an electric field applied to move the electrons. Therefore, the electrons have spin orbit coupling energy and cause a spin current in a non-magnetic material in the absence of a magnetic material.

However, there is a problem in that a high current is required to cause magnetization reversal in a ferromagnetic material using spin orbit torque. To improve this, a ferrimagnetic material may be used instead of a ferromagnetic material. However, when the ferrimagnetic material is used, the efficiency of the spin orbit torque does not increase significantly because a spin current induced by the spin Hall effect in a heavy metal layer, which is a lower non-magnetic metal, acts on a sublattice constituting the ferrimagnetic material. That is, since sublattices are arranged in a direction different from the magnetization direction of the spin current, the efficiency of the torque delivered to the ferrimagnetic material is not greatly increased.

To improve this, a structure of a synthetic antiferromagnetic material is proposed.

In U.S. application Ser. No. 15/845,985, a synthetic antiferromagnetic material is introduced and used as a fixed layer. Since the fixed layer should have spin asymmetry, a symmetry breaking layer is added to a lower portion or an upper portion of the structure of the synthetic antiferromagnetic material. However, this does not use spin orbit torque.

Therefore, a structure is required in which spin orbit torque can act simultaneously on two ferromagnetic layers to perform fast magnetization reversal even at low power.

DISCLOSURE

Technical Problem

A first technical object of the present invention is to provide a synthetic antiferromagnetic material capable of performing magnetization reversal at a low current.

Also, a second technical object of the present invention is to provide a multibit memory that uses the synthetic antiferromagnetic material provided through the first technical object.

Technical Solution

In order to achieve the first technical object, the present invention provides a synthetic antiferromagnetic material including a lower ferromagnetic layer; a Ruderman-Kittel-Kasuya-Yosida (RKKY) inducing layer formed on the lower ferromagnetic layer, and an upper ferromagnetic layer formed on the RKKY inducing layer, wherein the lower ferromagnetic layer and the upper ferromagnetic layer are set to have opposite magnetization directions by applying a charge current in a direction parallel to a surface of the RKKY inducing layer, and the RKKY inducing layer has a thickness at which the RKKY interaction is maximized.

In order to achieve the second technical object, the present invention provides a multibit memory including a first synthetic antiferromagnetic material, a first tunnel barrier layer formed on the first synthetic antiferromagnetic material, a second synthetic antiferromagnetic material formed on the first tunnel barrier layer, a second tunnel barrier layer formed on the second synthetic antiferromagnetic material, and a third synthetic antiferromagnetic material formed on the second tunnel barrier layer, wherein each of the synthetic antiferromagnetic materials includes a lower ferromagnetic layer, a Ruderman-Kittel-Kasuya-Yosida (RKKY) inducing layer formed on the lower ferromagnetic layer, and an upper ferromagnetic layer formed on the RKKY inducing layer, and wherein due to a program current applied in parallel to a surface of the RKKY inducing layer, the lower ferromagnetic layer and the upper ferromagnetic layer have perpendicular magnetic anisotropy and have magnetic moments in opposite directions.

Advantageous Effects

According to the present invention, a program current used to store data in a memory has a very small value compared to a current that induces magnetization reversal of a typical ferromagnetic material. Also, vertically stacked synthetic antiferromagnetic materials form resistance units. An RKKY inducing layer is disposed between the resistance units. During the data storage operation, the RKKY inducing layer acts as a channel of the program current that induces the RKKY interaction. The program current flows in a direction parallel to the surface of the RKKY inducing layer, and ferromagnetic layers in contact with the RKKY inducing layer have antiferromagnetic properties due to antiparallel magnetization.

Also, the RKKY inducing layer is formed of a non-magnetic heavy metal and thus acts as a channel in which a read current is supplied during a read operation. That is, a resistance unit is disposed on at least two RKKY inducing layers, and a read current or a read voltage is applied in a direction perpendicular to the surface of the RKKY inducing layer, and the resistance of ferromagnetic layers due to spin orbit coupling is measured. Therefore, when synthetic antiferromagnetic materials are cumulatively stacked, multibit data can be stored, and a read operation for the stored data of various states can be performed.

DESCRIPTION OF DRAWINGS

FIG. 1 is a cross-sectional view of a synthetic antiferromagnetic material according to an embodiment of the present invention.

FIG. 2 is a schematic diagram for explaining the operation of the synthetic antiferromagnetic material of FIG. 1 according to a preferred embodiment of the present invention.

FIG. 3 is a graph of measuring the magnetic moment of a synthetic antiferromagnetic material according to a manufacturing example of the present invention.

FIG. 4 is a graph showing the perpendicular magnetic anisotropy of a magnetic structure according to the manufacturing example of FIG. 3.

FIG. 5 is a graph of measuring the Hall resistance of a magnetic device according to a comparative example of the present invention.

FIG. 6 is an image for measuring the Hall resistance of the magnetic device of FIG. 5.

FIG. 7 is a graph of measuring the Hall resistance of another magnetic device for comparison to that of the magnetic device of FIG. 5 according to a comparative example of the present invention.

FIG. 8 is a cross-sectional view of a memory using a synthetic antiferromagnetic material according to a preferred embodiment of the present invention.

FIGS. 9 to 11 are cross-sectional views for illustrating the operation of the memory of FIG. 8 according to a preferred embodiment of the present invention.

BEST MODES

While the invention is susceptible to various modifications and alternative forms, specific embodiments thereof will be described in detail and shown by way of example. It should be understood, however, that there is no intent to limit the invention to the particular forms disclosed, but on the contrary, the invention is to cover all modifications, equivalents, and alternatives falling within the spirit and scope of the invention. In describing each drawing, like reference numerals are used for like elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in more detail with reference to the accompanying drawings.

EMBODIMENTS

FIG. 1 is a cross-sectional view of a synthetic antiferromagnetic material according to an embodiment of the present invention.

Referring to FIG. 1, a synthetic antiferromagnetic material according to an embodiment has a lower ferromagnetic layer 110, a Ruderman-Kittel-Kasuya-Yosida (RKKY) inducing layer 120, and an upper ferromagnetic layer 130.

The lower ferromagnetic layer 110 is a conventional ferromagnetic material, has Co, Fe, Ni, Mn, or one or more alloys thereof, and preferably includes CoFeB, NiFe, CoPt, CoPd, FePt, or FePd.

Also, the RKKY inducing layer 120 is preferably a non-magnetic metal or a conductive oxide. Ru, W or Ta may be used as the non-magnetic metal, and a general conductive oxide such as ITO or IZO may be used as the conductive oxide.

The upper ferromagnetic layer 130 is a conventional ferromagnetic material, has Co, Fe, Ni, Mn, or one or more alloys thereof, and preferably includes CoFeB, NiFe, CoPt, CoPd, FePt, or FePd. The upper ferromagnetic layer 130 is preferably made of the same material as the lower ferromagnetic layer 110.

The RKKY inducing layer 120 uses the RKKY interaction so that the lower ferromagnetic layer 110 and the upper ferromagnetic layer 130 have magnetic moments in opposite directions. The probability that a spin electron will have an up spin or a down spin at a specific point by the RKKY interaction is expressed as a wavelength. That is, the probability that the spins of electrons can be aligned in one direction is changed according to the thickness of the RKKY inducing layer 120. The RKKY interaction is related to a coupling mechanism of electron spins of a local internal d or f orbit or nuclear magnetic moments in a metal through the interaction of conduction electrons.

However, according to the present invention, when the RKKY inducing layer 120 has a specific thickness, it should be understood that the lower ferromagnetic layer 110 and the upper ferromagnetic layer 130 have opposite spins. Also, in order for the two ferromagnetic layers 110 and 130 to be in an antiparallel state, which have spins in opposite directions, and to exhibit perpendicular magnetic anisotropy in which the spin directions are aligned perpendicularly to an interface between film materials, each ferromagnetic layer 110 or 130 needs to have an RKKY inducing layer 120 positioned on one side and an oxide layer positioned in a direction opposite to the RKKY inducing layer 120 on the basis of each ferromagnetic layer 110 or 130.

FIG. 2 is a schematic diagram for explaining the operation of the synthetic antiferromagnetic material of FIG. 1 according to a preferred embodiment of the present invention.

Referring to FIG. 2, a current is applied through the RKKY inducing layer 120. In the present invention, currents may be classified into a charge current and a spin current. The charge current refers to the flow of charges due to a voltage difference or an electric field applied to the RKKY inducing layer 120, which is a target conductor. Also, the spin current refers to spin transport occurring along with electron movement in the case where spin polarization is non-zero when electrons having up-spin or down-spin flow under the influence of an electric field.

Typically, when an electric field or a voltage difference is applied to a non-magnetic metal, electron movement occurs, and among the moving electrons, the number of conduction electrons in the spin-up state is equal to the number of conduction electrons in the spin-down state. Therefore, the spin current is zero, and only charge transport occurs without spin transport.

In FIG. 2, when electrons flow through the RKKY inducing layer 120, the number of electrons in the spin-up state is equal to the number of electrodes in the spin-down state, and the current flows toward the lower ferromagnetic layer 110 or the upper ferromagnetic layer 130 depending on the spin direction of the electrons. In particular, when the lower ferromagnetic layer 110 and the upper ferromagnetic layer 130 are made of the same material, electrons having different spin states are directed to different ferromagnetic layers. For example, the electrons in the spin-up state flow toward the upper ferromagnetic layer 130, and the electrons in the spin-down state flow toward the lower ferromagnetic layer 110. This can be explained as a kind of spin Hall effect. However, the spin state of electrons flowing from the RKKY inducing layer 120, which is a non-magnetic metal layer, into the ferromagnetic layer may be determined by the direction of the charge current or the sign of the spin-orbit coupling of the non-magnetic metal layer.

That is, the number of electrons flowing toward the ferromagnetic layer and the strength of the spin orbit torque are determined by the thickness of the RKKY inducing layer 120 through the RKKY interaction. For example, when the RKKY inducing layer 120 has a specific thickness, the spin of electrons in the ferromagnetic layer may be set to an antiparallel state or a parallel state.

For example, at a thickness D1, the spin of electrons in each ferromagnetic layer is set to the antiparallel state. Therefore, when electrons flowing into the lower ferromagnetic layer 110 set the spin of the lower ferromagnetic layer 110 to an up state, the electrons flowing into the upper ferromagnetic layer 130 set the spin of the upper ferromagnetic layer 130 to a down state. This is a spin orbit torque due to the spin Hall effect. Also, when the thickness of the RKKY inducing layer is D2, the spin of electrodes in each ferromagnetic layer is set to the parallel state. In this case, the effect of RKKY and the effect of the spin orbit torque cancel each other out because the electrons flowing from the RKKY inducing layer 120 into the lower ferromagnetic layer 110 attempt to set the spin of the lower ferromagnetic layer 110 to the up state and the electrons flowing into the upper ferromagnetic layer 130 attempt to set the spin of the ferromagnetic layer 130 to the down state.

In FIG. 2, the spin current toward the upper ferromagnetic layer 130 sets the upper ferromagnetic layer 130 to magnetization in a spin-up state, and the spin current toward the lower ferromagnetic layer 110 sets the lower ferromagnetic layer 110 to magnetization in a spin-down state. At a first thickness D1, the two ferromagnetic layers 110 and 130 may have magnetization in the antiparallel state through the RKKY interaction. In this case, when charge current flows into the RKKY inducing layer 120, a spin current in each direction tries to, through spin orbit torque, make the upper ferromagnetic layer 130 be the magnetization in the up state and make the lower ferromagnetic layer 110 be the magnetization in the down state. The spin orbit torque is a torque to make the upper ferromagnetic layer and the lower ferromagnetic layer in opposite directions, and at this time, the RKKY interaction appearing at the first thickness D1 serves to assist the spin orbit torque.

In addition, at a second thickness D2, the upper ferromagnetic layer 130 and the lower ferromagnetic layer 130 have magnetization in a parallel state through the RKKY interaction. However, the spin orbit torque attempts to turn the magnetization of each ferromagnetic layer in the opposite direction, and at the second thickness D2, the RKKY interaction plays a role in interfering with the spin orbit torque.

In the present invention, the thickness D1 of the RKKY inducing layer 120 at which the RKKY interaction is maximized is defined as a first maximum point, and the thickness D2 of the RKKY inducing layer 120 is defined as a first local minimum point.

For example, when the thickness of the RKKY inducing layer 120 is the first maximum point, the RKKY interaction serves to assist the spin orbit torque acting on the lower ferromagnetic layer 110 and the upper ferromagnetic layer 130. On the other hand, when the thickness of the RKKY inducing layer 120 has a first minimum point, the RKKY interaction serves to interfere with the spin orbit torque applied to the lower ferromagnetic layer 110 and the upper ferromagnetic layer 130.

Also, when the thickness of the RKKY inducing layer 120 have a value ranging between the first maximum point D1 and a second maximum point D2, the interaction between the lower ferromagnetic layer 110 and the upper ferromagnetic layer 130 disappears, and the role of the RKKY interaction is lost because the magnetic layers act independently. However, the induced spin of electrons causes a normal spin orbit torque that is neither strengthened nor weakened at interfaces between the RKKY inducing layer 120 and the ferromagnetic layers 110 and 130 in the spin-down state or in the spin-up state.

That is, when the RKKY inducing layer has a specific thickness (the first maximum point D1) due to the RKKY interaction, the spin orbital torque of the ferromagnetic layer is strengthened. Therefore, even when a low current is applied to the RKKY inducing layer, the two ferromagnetic layers may have perpendicular magnetic anisotropy and form an antiferromagnetic state with opposite spins.

Manufacturing Example: Confirmation of Synthetic Antiferromagnetic Formation

FIG. 3 is a graph of measuring the magnetic moment of a synthetic antiferromagnetic material according to a manufacturing example of the present invention.

Referring to FIG. 3, a first perpendicular magnetic anisotropy (PMA) inducing film, which is an oxide, a lower ferromagnetic layer, an RKKY inducing layer, an upper ferromagnetic layer, a second PMA inducing film, which is an oxide, and a capping layer are formed on a silicon oxide substrate. The lower ferromagnetic layer, the RKKY inducing layer, and the upper ferromagnetic layer constitute the synthetic antiferromagnetic material of FIG. 1, and the first PMA inducing layer and the second PMA inducing layer are used to induce perpendicular magnetic anisotropy of the adjacent ferromagnetic layer.

In FIG. 3, film materials other than the substrate are formed through a sputtering process, and the basic pressure of a chamber is $2 \times 10^{-7}$ Torr, and the pressure during the process is $3 \times 10^{-3}$ Torr.

The first PMA inducing film is made of MgO and is formed to a thickness of 1 nm by applying an RF power of 50 W. The lower ferromagnetic layer is made of CoFeB and is formed to a thickness of 1.3 nm through 12 W DC power supply using a target having a Co content of 20%, a Fe content of 60%, and a B content of 20%. Also, the RKKY inducing layer is made of W and has a thickness of 0.1 nm to 2.5 nm through 12 W DC power supply.

The upper ferromagnetic layer, which is formed using the same formation process as the lower ferromagnetic layer, has a CoFeB material and a thickness of 1.3 nm. Also, the second PMA inducing film is formed through the same process as the first PMA inducing film, is made of MgO, and has a thickness of 1 nm. Also, the capping layer is made of Ta and has a thickness of 3 nm through 12 W DC power supply. Also, each process is performed at room temperature. After the formation of the film material, heat treatment is performed at 350° C. for 1 hour.

Through the above-described process, a magnetic structure of $SiO_2$/MgO(1 nm)/CoFeB(1.3 nm)/W($t_w$)/CoFeB(1.3 nm)/MgO(1 nm)/Ta(3 nm) is formed, and CoFeB/W/CoFeB forms a synthetic antiferromagnetic material. In the magnetic structure, MgO is used as a film material for inducing the perpendicular magnetic anisotropy of CoFeB. Since CoFeB easily has perpendicular magnetic anisotropy at an oxide interface, MgO is used. Also, Ta used as the capping layer prevents further oxidation of MgO.

Also, in FIG. 3, a graph ■ represents a parallel magnetic moment when an external magnetic field is applied in a direction parallel to the interface between the film materials, and a graph ● represents a perpendicular magnetic moment when an external magnetic field is applied in a direction perpendicular to the interface between the film materials. Also, the X-axis represents an externally applied magnetic field, and the Y-axis represents the magnetic moment of the magnetic structure.

In the graph ■, first, when an external magnetic field is applied horizontally to an interface between film materials, the horizontal magnetic moment of the ferromagnetic layer exhibits a symmetrical characteristic. That is, when the external horizontal magnetic field increases, the horizontal magnetic moment also increases symmetrically with respect to 0 Oe and is saturated at a specific magnetic field strength. However, as the thickness of W increases, the strength of the external magnetic field at which the horizontal magnetic moment is saturated increases somewhat. This is related to the perpendicular magnetic anisotropy of CoFeB, which is a ferromagnetic layer. The perpendicular magnetic anisotropy of CoFeB appears at the interface of MgO. Also, the perpendicular magnetic anisotropy is enhanced when B in CoFeB moves in the direction of W, which is a heavy metal, and CoFe is well established with the interface of MgO. If W, which is a heavy metal, is thick, W absorbs B well, so that the perpendicular magnetic anisotropy of CoFeB can be easily exhibited. When the perpendicular magnetic anisotropy is readily exhibited, a magnetic moment in the horizontal direction is saturated with respect to a relatively strong external magnetic field.

Also, the graph ● shows that a magnetic moment in the direction perpendicular to the interfaces is measured after an external magnetic field is applied in a direction perpendicular to the interfaces of the magnetic structure. It can be seen that the formed magnetic structure reacts very sensitively to a perpendicular magnetic field applied from the outside. That is, it can be seen that the formed magnetic structure is a structure that makes it very easy to have perpendicular magnetic anisotropy. However, since the unit value for the external magnetic field is large, the exact change in the perpendicular magnetic moment with respect to the strength of the external magnetic field is not found.

FIG. 4 is a graph showing the perpendicular magnetic anisotropy of a magnetic structure according to the manufacturing example of FIG. 3.

Referring to FIG. 4, the graph ● of FIG. 3 is enlarged and shown. It can be seen that two ferromagnetic layers act as one layer when the thickness of W, which is an RKKY inducing layer, is 0.1 nm to 1 nm. That is, typical hysteresis characteristics appearing in one ferromagnetic material appear. However, when the thickness of W is 1.5 nm or more, an operation appears in which the first ferromagnetic layer and the second ferromagnetic layer are clearly separated. That is, it can be seen that when the external magnetic field has a value of 0 Oe, the magnetic moment also has a value of 0 emu. It is interpreted that the first ferromagnetic material and the second ferromagnetic material exhibit antiferromagnetic coupling. That is, since the two ferromagnetic materials have perpendicular magnetic anisotropy in opposite directions to each other, the magnetic moment of the entire magnetic structure viewed from the outside appears as 0 emu. Thus, it can be seen that a synthetic antiferromagnetic material corresponding to the RKKY interaction is formed at a specific W thickness.

Comparative Example

FIG. 5 is a graph of measuring the Hall resistance of a magnetic device according to a comparative example of the present invention.

Referring to FIG. 5, the thickness of W, which is an RKKY inducing layer, in the device of FIG. 3 is 2 nm, and two ferromagnetic layers are antiferromagnetically coupled to each other by the RKKY interaction. Also, the magnetic device has a structure of $SiO_2$/MgO(1 nm)/CoFeB(1.3 nm)/W(2 nm)/CoFeB(1.3 nm)/MgO(1 nm)/Ta(3 nm) and acts as a Hall device.

FIG. 6 is an image for measuring the Hall resistance of the magnetic device of FIG. 5.

The magnetic device 20 has a cross-shaped structure for measurement of Hall resistance, and electrodes are set to Ti(3 nm)/Pt(50 nm). Also, the magnetic device 20 is disposed in a cross shape on an $SiO_2$ substrate 10, a current is applied to two input electrodes 21 and 22 disposed on the X-axis, and a Hall voltage is measured through two output electrodes 23 and 24 disposed on the Y-axis. The Hall resistance is a value obtained by dividing the measured Hall voltage by the applied current. Also, an external magnetic field is applied in a direction parallel to the substrate 10. This is to induce the magnetization reversal of the magnetic device 20 by the spin orbit torque. That is, the external magnetic field is applied in the same direction as the direction of the current. When spin electrons move in the vertical direction due to the spin orbit coupling, a torque is generated in the spin electrons by an external magnetic field in a direction parallel to the charge current, and the Hall voltage is generated at the output electrodes 23 and 24 by the generated torque. Also, when the strength of the applied external magnetic field increases, the magnetic device 20 easily performs magnetization reversal by the spin orbit torque. That is, when the Hall resistance is changed from (+) to (−), magnetization reversal occurs in the ferromagnetic layers constituting the magnetic device 20, and a kind of switching is performed.

The switching current at which the magnetization reversal occurs in FIG. 6 has a value of 0.5 mA to 1.2 mA. Also, as the externally applied magnetic field increases, the switching current tends to increase. This is because the externally applied magnetic field interferes with the RKKY interaction.

FIG. 7 is a graph of measuring the Hall resistance of another magnetic device for comparison to that of the magnetic device of FIG. 5 according to a comparative example of the present invention.

Referring to FIG. 7, another magnetic device has a structure of $SiO_2$/W(2 nm)/CoFeB(1.3 nm)/MgO(1 nm)/Ta(3 nm). That is, W, which is a non-magnetic heavy metal, is disposed below, and MgO for inducing perpendicular magnetic anisotropy is formed above CoFeB, which is a ferromagnetic layer. The formed magnetic device has the structure disclosed in FIG. 6.

In FIG. 7, magnetization reversal is performed at approximately 2 mA to 3 mA. That is, a positive resistance is changed to a negative resistance, or a negative resistance is changed to a positive resistance. The structure of the magnetic device of FIG. 7 excludes the synthetic antiferromagnetic structure. That is, a magnetization reversal characteristic of a general ferromagnetic material with perpendicular magnetic anisotropy is exhibited.

Comparing FIGS. 5 and 7, it can be seen that the structure of FIG. 5 having a synthetic antiferromagnetic structure requires a very low current for magnetization reversal. In the case of FIG. 7, a current of 2 mA to 3 mA is required for magnetization reversal, but an operating current of 0.5 mA to 1.2 mA is required in FIG. 5. That is, the synthetic antiferromagnetic structure requires a low operating current for magnetization reversal and thus has an advantage of very low power consumption during device fabrication.

FIG. 8 is a cross-sectional view of a memory using a synthetic antiferromagnetic material according to a preferred embodiment of the present invention.

Referring to FIG. 8, synthetic antiferromagnetic materials 200, 300, and 400 are vertically stacked. Although not shown, other functional film materials or wirings may be formed on a substrate, and the vertically stacked structure of the synthetic antiferromagnetic materials 200, 300, and 400 may store multiple bits.

The memory has a first synthetic antiferromagnetic material 200, a second synthetic antiferromagnetic material 300, and a third synthetic antiferromagnetic material 400, and the three synthetic antiferromagnetic materials 200, 300, and 400 are vertically stacked. Also, tunnel barrier layers 250 and 350 are formed between the synthetic antiferromagnetic materials 200, 300, and 400. That is, the first tunnel barrier layer 250 is formed between the first synthetic antiferromagnetic material 200 and the second synthetic antiferromagnetic material 300, and the second tunnel barrier layer 350 is formed between the second synthetic antiferromagnetic material 300 and the third synthetic antiferromagnetic material 400. The number of stacked synthetic antiferromagnetic materials may increase according to the number of bits to be stored in one cell. However, it is preferred that the tunnel barrier layers 250 and 350 be formed between the synthetic antiferromagnetic materials 200, 300, and 400.

Each of the synthetic antiferromagnetic materials 200, 300, and 400 has the same configuration as described in FIG. 1. Accordingly, the RKKY inducing layers 220, 320, and 420 are formed between the lower ferromagnetic layers 210, 310, and 410 and the upper ferromagnetic layers 230, 330, and 430, respectively, and the RKKY inducing layers 220, 320, and 420 induce an antiparallel state of spin electrons applied to the upper or lower ferromagnetic layers. Accordingly, the RKKY inducing layers 220, 320, and 420 have the thickness of the maximum point. The configurations and materials of the synthetic antiferromagnetic materials 200, 300, and 400 are the same as those described with reference to FIGS. 1 and 2.

Also, as the tunnel barrier layers 250 and 350, a material that is easy to induce perpendicular magnetic anisotropy of a ferromagnetic layer brought in contact with the tunnel barrier layers 250 and 350 may be selected. Accordingly, the tunnel barrier layers 250 and 350 are oxides and preferably MgO. Also, resistance is changed depending on the magnetization direction of two ferromagnetic layers brought in contact with the tunnel barrier layers 250 and 350. That is, upper and lower ferromagnetic layers arranged around the tunnel barrier layers 250 and 350 form one resistance unit 260 or 360. Also, the resistance of the resistance units 260 and 360 is determined according to the spin directions of the upper and lower ferromagnetic layers arranged around the tunnel barrier layers 250 and 350. For example, when the magnetization directions of the upper ferromagnetic layer and the lower ferromagnetic layer disposed around the tunnel barrier layers 250 and 350 are in the same parallel state, the resistance unit is in a low resistance state. Also, when the magnetization directions of the upper ferromagnetic layer and the lower ferromagnetic layer are opposite to each other and in an antiparallel state, the resistance unit is in a high resistance state. Thus, multibit data can be stored, and multiple states are implemented.

The resistance units 260 and 360 are defined by the synthetic antiferromagnetic materials 200, 300, and 400 which are cumulatively stacked. That is, the first upper ferromagnetic layer 230, the first tunnel barrier layer 250, and the second lower ferromagnetic layer 310 form the first resistance unit 260. Also, the second upper ferromagnetic layer 330, the second tunnel barrier layer 350, and the third lower ferromagnetic layer 410 form the second resistance unit 360. When another synthetic antiferromagnetic material is added to a lower portion of the first synthetic antiferromagnetic material 200 or when still another synthetic antiferromagnetic material is added to an upper portion of the third synthetic antiferromagnetic material 400, the number of resistance units may be further increased. Each of the resistance units 260 and 360 has a structure that is disposed between the RKKY inducing layers 220, 320, and 420. Therefore, during a program or write operation of the memory, a program current is applied in a direction parallel to the RKKY inducing layers 220, 320, and 420 to induce antiparallel magnetization of the ferromagnetic layers, and during a read operation, a current or voltage is supplied in a direction perpendicular to the RKKY inducing layers 220, 320, and 420 to measure the resistance state of the resistance units 260 and 360.

In the synthetic antiferromagnetic material 200, 300, and 400, the RKKY inducing layers 220, 320, 420 implement an antiparallel magnetization state in which magnetization directions are opposite to each other in the lower ferromagnetic layer and the upper ferromagnetic layer brought in contact with the RKKY inducing layers 220, 320, and 420. Also, an antiparallel magnetization state in a specific direction is implemented in another lower ferromagnetic layer and another upper ferromagnetic layer by the direction of the current flowing through the RKKY inducing layer in the adjacent synthetic antiferromagnetic material. The tunnel barrier layers 250 and 350 are provided between the synthetic antiferromagnetic materials 200, 300, and 400, and the ferromagnetic materials brought in contact with the tunnel barrier layers 250 and 350 implement a memory state according to spin orbit coupling.

FIGS. 9 to 11 are cross-sectional views for illustrating the operation of the memory of FIG. 8 according to a preferred embodiment of the present invention.

Referring to FIG. 9, a first program current I1 flows to the first RKKY inducing layer 220, a second program current I2 flows to the second RKKY inducing layer 320, and a third program current I3 flows to the third RKKY inducing layer 420. Each program current flows in parallel to interfaces where the RKKY inducting layers 220, 320, and 420 are in contact with the ferromagnetic layers. Also, the first program current I1 and the third program current I3 flow to the right, and the second program current I2 flows to the left. That is, the program currents are applied by alternately changing directions according to the synthetic antiferromagnetic material.

For example, due to a first program current I1 flowing through the first RKKY inducing layer 220, a first lower ferromagnetic layer 210 of the first synthetic antiferromagnetic material 200 has a downward magnetic moment, and a first upper ferromagnetic layer 230 has an upward magnetic moment. Also, due to a second program current I2 flowing through the second RKKY inducing layer 320, a second lower ferromagnetic layer 310 of the second synthetic antiferromagnetic material 300 has an upward magnetic moment, and a second upper ferromagnetic layer 330 has a downward magnetic moment. Due to a third program current I3 flowing through the third RKKY inducing layer 420 in the third synthetic antiferromagnetic material 400 formed above the second synthetic antiferromagnetic material 300, a third lower ferromagnetic layer 410 has a downward magnetic moment, and a third upper ferromagnetic layer 430 has an upward magnetic moment.

The magnetic moments of the upper and lower ferromagnetic layers in contact with the RKKY inducing layers 220, 320, and 420 exhibit perpendicular magnetic anisotropy in opposite directions regardless of the directions of the program currents flowing through the RKKY inducing layers 220, 320, and 420. This results from the RKKY interaction.

Also, the first upper ferromagnetic layer 230, the first tunnel barrier layer 250, and the second lower ferromagnetic layer 310 form the first resistance unit 260. Also, the second upper ferromagnetic layer 330, the second tunnel barrier layer 350, and the third lower ferromagnetic layer 410 form the second resistance unit 360. The resistance units 260 and 360 constitute a magnetic memory by spin orbit coupling.

The ferromagnetic layers 230 and 310 constituting the first resistance unit 260 have magnetic moments in the same direction. Therefore, the first resistance unit 260 disposed between the second RKKY inducing layer 320 and the first RKKY inducing layer 220 has a low resistance R1. The ferromagnetic layers 330 and 410 constituting the second resistance unit 360 formed on the first resistance unit 260 have magnetic moments in the same direction and thus have a low resistance value R2. When the composition and thickness of the film material forming the first resistance unit 260 are the same as those of the film material forming the second resistance unit 360, the low resistance values of the two resistance units 260 and 360 may be the same.

In particular, when program currents in opposite directions flow through adjacent RKKY inducing layers, the resistance of the resistance unit becomes the minimum value, and a memory implementing multiple bits becomes a low resistance state.

Referring to FIG. 10, the program currents I1, I2, and I3 flowing through the RKKY inducing layers 220, 320, and 420 are all set in the same direction. Accordingly, the synthetic antiferromagnetic materials 200, 300, and 400 exhibit the same magnetization state. That is, the magnetization of all the lower ferromagnetic layers 210, 310, and 410 may be downward, and the magnetization of all the upper ferromagnetic layers 230, 330, and 430 may be upward. The magnetization direction of the lower ferromagnetic layers 210, 310, and 410 and the magnetization direction of the upper ferromagnetic layers 230, 330, 430 are determined by the directions of the program currents I1, I2, and I3 flowing through the RKKY inducing layers 220, 320, and 420.

Also, the ferromagnetic layers 230 and 310 constituting the first resistance unit 260 have magnetization states in opposite directions and are in the antiparallel state. Accordingly, the first resistance unit 260 has a high resistance R1+ΔR1. The ferromagnetic layers 330 and 410 constituting the second resistance unit 360 formed on the first resistance unit 260 have magnetization states in opposite directions and have a high resistance R2+ΔR2. That is, when the program currents I1, I2, and I3 are set to flow to the RKKY inducing layers 220, 320, and 340 in the same direction in the memory, the memory enters the maximum resistance state.

Referring to FIG. 11, the first program current I1 flowing through the first RKKY inducing layer 220 of the first synthetic antiferromagnetic material 200 is in the opposite direction to the second program current I2 flowing through the second RKKY inducing layer 320 of the second synthetic antiferromagnetic material 300. Accordingly, the first upper ferromagnetic layer 230 and the second lower ferromagnetic layer 310 constituting the first resistance unit 260 have magnetization states in the same direction and implement R1, which is a low resistance state.

Also, the third program current I3 flowing through the third RKKY inducing layer 420 of the third synthetic antiferromagnetic material 400 is in the same direction as the second program current I2. Accordingly, the second upper ferromagnetic layer 330 and the third lower ferromagnetic layer 410 constituting the second resistance unit 360 have magnetization in opposite directions. The second resistance unit 360 having magnetization states in opposite directions has a high resistance state and has a resistance value R2+ΔR2.

That is, in FIGS. 9 to 11, the resistance states of the resistance units 260 and 360 formed by the synthetic antiferromagnetic materials 200, 300, and 400 stacked in the vertical direction are determined by the direction of current flowing in parallel to the RKKY inducing layers 220, 320, and 420. In addition, a read current is supplied downward from above to read the resistance states of the resistance units 260 and 360. When the read current is supplied, the resistance of the memory in the state of FIG. 9 is R1+R2, the resistance of the memory in the state of FIG. 10 is R1+R2+ΔR1+ΔR2, and the resistance of the memory in the state of FIG. 11 is R1+R2+ΔR2. In FIG. 11, when the first program current I1 and the second program current I2 are set in the same direction and the second program current I2 and the third program current I3 are set in opposite directions, it is possible to implement a resistance value R1+R2+ΔR1.

That is, the resistance state of the resistance units 260 and 360 may be adjusted by adjusting the directions of currents applied to the RKKY inducing layers 220, 320, and 420, and the resistance units 260 and 360 may be formed by stacking the synthetic antiferromagnetic materials 200, 300, and 400. In particular, the RKKY inducing layers 220, 320, and 420 have a thickness that maximizes the RKKY interaction, and thus it is possible to induce magnetization reversal switching even with a low amount of current. Thus, advantageously, it is possible to decrease the amount of program current supplied to change the resistance state of the resistance units 260 and 360.

Also, a read operation is performed by applying a current or voltage to the resistance units 260 and 360 that are vertically stacked. A program operation for storing data is performed by applying a program current in a direction parallel to the RKKY inducing layers 220, 320, and 420. An operation of reading the stored data may be performed by applying a current or voltage through an electrode disposed above or below the memory and may be performed through the entire resistance of the resistance units 260 and 360 formed by a combination of the plurality of synthetic antiferromagnetic materials 200, 300, and 400.

In the above structure and operation, a program current used to store data in a memory has a very small value compared to a current that induces magnetization reversal of a typical ferromagnetic material. Also, vertically stacked synthetic antiferromagnetic materials form resistance units. An RKKY inducing layer is disposed between the resistance units. During the data storage operation, the RKKY inducing layer acts as a channel of the program current that induces the RKKY interaction. The program current flows in a direction parallel to the surface of the RKKY inducing layer, and ferromagnetic layers in contact with the RKKY inducing layer have antiferromagnetic properties due to antiparallel magnetization. Also, the RKKY inducing layer is formed of a non-magnetic heavy metal and thus acts as a channel in which a read current is supplied during a read operation. That is, a resistance unit is disposed on at least two RKKY inducing layers, and a read current or a read voltage is applied in a direction perpendicular to the surface of the RKKY inducing layer, and the resistance of ferromagnetic layers due to spin orbit coupling is measured. Therefore, when synthetic antiferromagnetic materials are cumulatively stacked, multibit data may be stored, and a read operation for the stored data of various states may be performed.

The invention claimed is:

1. A synthetic antiferromagnetic material comprising:
a lower ferromagnetic layer;
a Ruderman-Kittel-Kasuya-Yosida (RKKY) inducing layer formed on the lower ferromagnetic layer;
an upper ferromagnetic layer formed on the RKKY inducing layer;
a first perpendicular magnetic anisotropy (PMA) inducing layer in contact with a lower portion of the lower ferromagnetic layer; and
a second PMA inducing layer in contact with an upper portion of the upper ferromagnetic layer,
wherein the first PMA inducing layer enhances perpendicular magnetic anisotropy of the lower ferromagnetic layer, and
wherein the second PMA inducing layer enhances perpendicular magnetic anisotropy of the upper ferromagnetic layer,
wherein the lower ferromagnetic layer and the upper ferromagnetic layer are set to have opposite magnetization directions by applying a charge current in a direction parallel to a surface of the RKKY inducing layer, and
wherein the RKKY inducing layer has a thickness at which the RKKY interaction is maximized.

2. The synthetic antiferromagnetic material of claim 1, wherein the lower ferromagnetic layer has CoFeB, NiFe, CoPt, CoPd, FePt, or FePd.

3. The synthetic antiferromagnetic material of claim 2, wherein the upper ferromagnetic layer has the same material as the lower ferromagnetic layer.

4. The synthetic antiferromagnetic material of claim 1, wherein the RKKY inducing layer has a non-magnetic metal or a conductive oxide.

5. The synthetic antiferromagnetic material of claim 4, wherein the RKKY inducing layer has Ru, W or Ta, and when the RKKY inducing layer has W, the RKKY inducing layer has a thickness of 1.5 nm to 2.5 nm.

6. The synthetic antiferromagnetic material of claim 1, wherein the synthetic antiferromagnetic material has a magnetic moment of 0 emu when an external magnetic field is 0 Oe.

7. A multibit memory comprising:
a first synthetic antiferromagnetic material;
a first tunnel barrier layer formed on the first synthetic antiferromagnetic material;
a second synthetic antiferromagnetic material formed on the first tunnel barrier layer;
a second tunnel barrier layer formed on the second synthetic antiferromagnetic material; and
a third synthetic antiferromagnetic material formed on the second tunnel barrier layer,
wherein each of the synthetic antiferromagnetic materials comprises:
a lower ferromagnetic layer;
a Ruderman-Kittel-Kasuya-Yosida (RKKY) inducing layer formed on the lower ferromagnetic layer; and
an upper ferromagnetic layer formed on the RKKY inducing layer,
wherein due to a program current applied in parallel to a surface of the RKKY inducing layer, the lower ferromagnetic layer and the upper ferromagnetic layer have perpendicular magnetic anisotropy and have magnetic moments in opposite directions,
wherein the upper ferromagnetic layer of the first synthetic antiferromagnetic material, the first tunnel barrier layer formed on the upper ferromagnetic layer of the first synthetic antiferromagnetic material, and a lower ferromagnetic layer of the second synthetic antiferromagnetic material in contact with the first tunnel barrier layer form a first resistance unit, and
the upper ferromagnetic layer of the second synthetic antiferromagnetic material, the second tunnel barrier layer formed on the upper ferromagnetic layer of the second synthetic antiferromagnetic material, and a lower ferromagnetic layer of the third synthetic antiferromagnetic material in contact with the second tunnel barrier layer form a second resistance unit.

8. The multibit memory of claim 7, wherein
a resistance state of the first resistance unit is determined by a first program current flowing in parallel to a first RKKY inducing layer of the first synthetic antiferromagnetic material and a second program current flowing in parallel to a second RKKY inducing layer of the second synthetic antiferromagnetic material, and
a resistance state of the second resistance unit is determined by the second program current and a third program current flowing in parallel to a third RKKY inducing layer of the third synthetic antiferromagnetic material.

9. The multibit memory of claim 8, wherein
when the first program current and the second program current are in opposite directions, the first resistance unit is in a low resistance state,
when the first program current and the second program current are in the same direction, the first resistance unit is in a high resistance state,
when the second program current and the third program current are in opposite directions, the second resistance unit is in a low resistance state, and
when the second program current and the third program current are in the same direction, the second resistance unit is in a high resistance state.

10. The multibit memory of claim 9, wherein the resistance state of the first resistance unit and the resistance state of the second resistance unit are checked by supplying a current in a direction perpendicular to surfaces of the synthetic antiferromagnetic materials.

11. The multibit memory of claim 8, wherein during a read operation of the multibit memory, a current flows perpendicularly to the first RKKY inducing layer, the second RKKY inducing layer, and the third RKKY inducing layer.

* * * * *